United States Patent
Tung et al.

(10) Patent No.: US 10,483,264 B2
(45) Date of Patent: Nov. 19, 2019

(54) FINFET CMOS DEVICE INCLUDING SINGLE DIFFUSION BREAK IN EACH OF NMOS AND PMOS REGIONS

(71) Applicant: UNITED MICROELECTRONICS CORP., Hsin-Chu (TW)

(72) Inventors: Yen-Wei Tung, Tainan (TW); Jen-Yu Wang, Tainan (TW); Cheng-Tung Huang, Kaohsiung (TW); Yan-Jou Chen, Yunlin County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/660,970

(22) Filed: Jul. 27, 2017

(65) Prior Publication Data
US 2019/0006360 A1 Jan. 3, 2019

(30) Foreign Application Priority Data

Jun. 28, 2017 (TW) .............................. 106121517 A

(51) Int. Cl.
*H01L 27/092* (2006.01)
*H01L 29/66* (2006.01)
(Continued)

(52) U.S. Cl.
CPC ...... *H01L 27/0924* (2013.01); *H01L 21/0217* (2013.01); *H01L 21/32139* (2013.01);
(Continued)

(58) Field of Classification Search
CPC ......... H01L 27/0924; H01L 21/823821; H01L 29/66795; H01L 29/7831; H01L 29/785; H01L 29/41791; H01L 2924/13067; H01L 21/823431; H01L 21/845; H01L 27/0886; H01L 27/10826; H01L 27/10879; H01L 27/1211; H01L 27/0922
See application file for complete search history.

(56) References Cited

U.S. PATENT DOCUMENTS

| | | | |
|---|---|---|---|
| 2015/0187770 A1* | 7/2015 | Mehrotra | H01L 27/0922 257/369 |
| 2015/0279995 A1* | 10/2015 | Maeda | H01L 29/7848 257/192 |

(Continued)

OTHER PUBLICATIONS

Tseng, Title of Invention:Semiconductor Structure and Method of Forming the Same, U.S. Appl. No. 15/250,924, filed Aug. 30, 2016.
(Continued)

*Primary Examiner* — Erik Kielin
(74) *Attorney, Agent, or Firm* — Winston Hsu

(57) ABSTRACT

A method for fabricating semiconductor device includes the steps of: forming a first fin-shaped structure on a substrate; forming a first single diffusion break (SDB) structure in the first fin-shaped structure; forming a first gate structure on the first SDB structure and a second gate structure on the first fin-shaped structure; forming an interlayer dielectric (ILD) layer around the first gate structure and the second gate structure; forming a patterned mask on the first gate structure; and performing a replacement metal gate (RMG) process to transform the second gate structure into a metal gate.

6 Claims, 6 Drawing Sheets

(51) Int. Cl.
*H01L 29/06* (2006.01)
*H01L 29/78* (2006.01)
*H01L 29/49* (2006.01)
*H01L 29/51* (2006.01)
*H01L 29/423* (2006.01)
*H01L 29/165* (2006.01)
*H01L 21/8238* (2006.01)
*H01L 21/3213* (2006.01)
*H01L 21/762* (2006.01)
*H01L 21/02* (2006.01)
*H01L 27/02* (2006.01)

(52) U.S. Cl.
CPC .......... *H01L 21/76224* (2013.01); *H01L 21/823821* (2013.01); *H01L 21/823842* (2013.01); *H01L 21/823878* (2013.01); *H01L 27/0207* (2013.01); *H01L 27/0922* (2013.01); *H01L 29/0649* (2013.01); *H01L 29/66545* (2013.01); *H01L 29/7848* (2013.01); *H01L 29/165* (2013.01); *H01L 29/42364* (2013.01); *H01L 29/42376* (2013.01); *H01L 29/4916* (2013.01); *H01L 29/4966* (2013.01); *H01L 29/517* (2013.01); *H01L 29/518* (2013.01)

(56) References Cited

U.S. PATENT DOCUMENTS

| | | | |
|---|---|---|---|
| 2015/0325575 A1* | 11/2015 | Park | H01L 29/0653 257/401 |
| 2016/0163604 A1* | 6/2016 | Xie | H01L 21/823878 257/401 |
| 2016/0336183 A1* | 11/2016 | Yuan | H01L 29/66795 |
| 2017/0200651 A1* | 7/2017 | Lee | H01L 27/088 |
| 2017/0373144 A1* | 12/2017 | Pandey | H01L 29/0653 |
| 2018/0006035 A1* | 1/2018 | Yuan | H01L 21/823878 |

OTHER PUBLICATIONS

Hsu, Title of Invention:Complementary Metal Oxide Semiconductor Device and Method of Forming the Same, U.S. Appl. No. 15/446,009, filed Mar. 1, 2017.

* cited by examiner

FINFET CMOS DEVICE INCLUDING SINGLE DIFFUSION BREAK IN EACH OF NMOS AND PMOS REGIONS

BACKGROUND OF THE INVENTION

1. Field of the Invention

The invention relates to a method for fabricating semiconductor device, and more particularly to a method of integrating single diffusion break (SDB) structure fabrication and metal gate process.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication, after shallow trench isolation (STI) is formed around the fin-shaped structure part of the fin-shaped structure and part of the STI could be removed to form a trench, and insulating material is deposited into the trench to form single diffusion break (SDB) structure or isolation structure. However, the integration of the SDB structure and metal gate fabrication still remains numerous problems. Hence how to improve the current FinFET fabrication and structure has become an important task in this field.

SUMMARY OF THE INVENTION

According to an embodiment of the present invention, a method for fabricating semiconductor device includes the steps of: forming a first fin-shaped structure on a substrate; forming a first single diffusion break (SDB) structure in the first fin-shaped structure; forming a first gate structure on the first SDB structure and a second gate structure on the first fin-shaped structure; forming an interlayer dielectric (ILD) layer around the first gate structure and the second gate structure; forming a patterned mask on the first gate structure; and performing a replacement metal gate (RMG) process to transform the second gate structure into a metal gate.

According to another aspect of the present invention, a semiconductor device includes: a first fin-shaped structure on a substrate; a first single diffusion break (SDB) structure in the first fin-shaped structure; a first gate structure on the first SDB structure; and a second gate structure on the first fin-shaped structure, in which the first gate structure and the second gate structure comprise different material.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
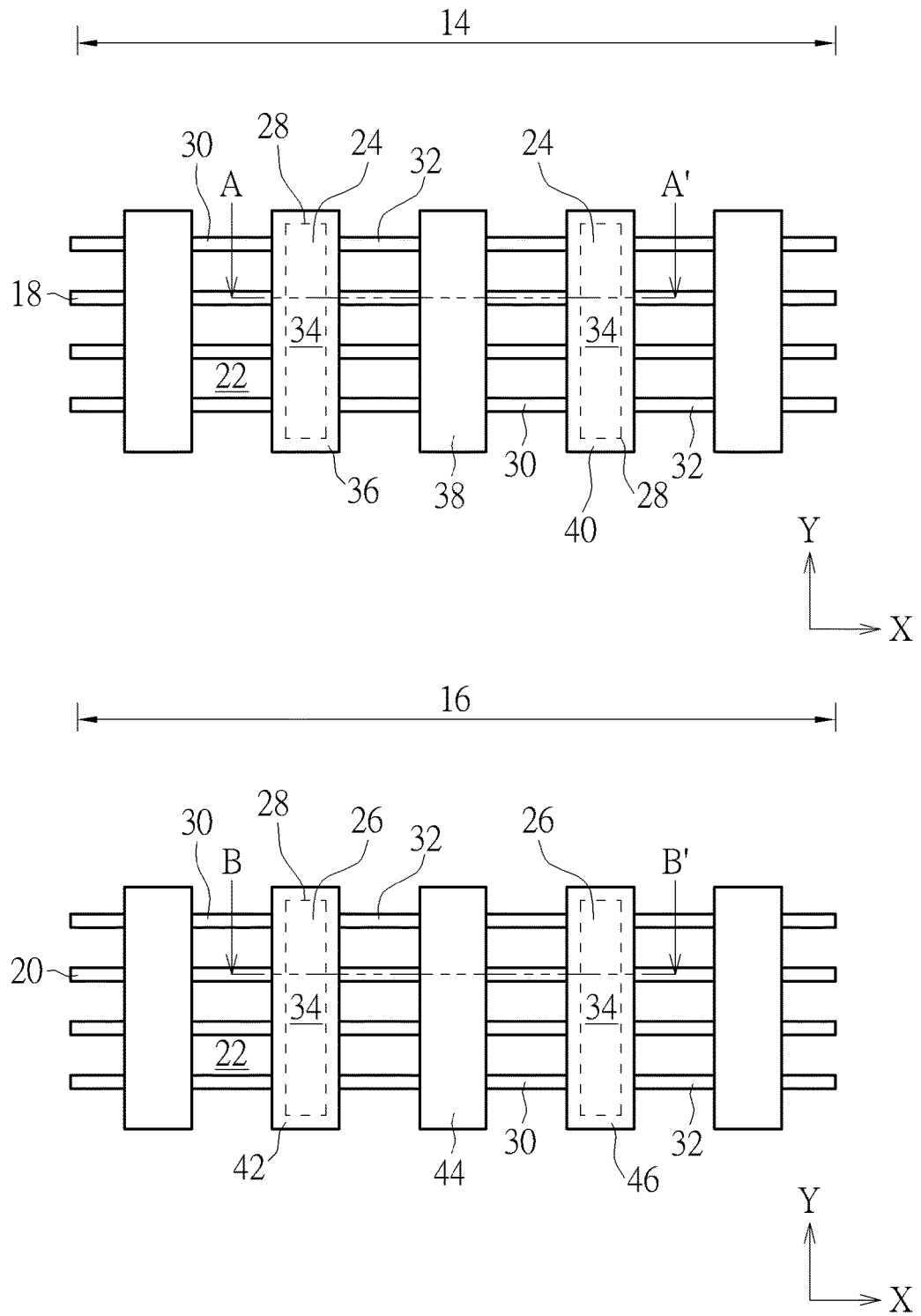
FIGS. 1-6 illustrate a method for fabricating a semiconductor device according to an embodiment of the present invention.
Figure 2:
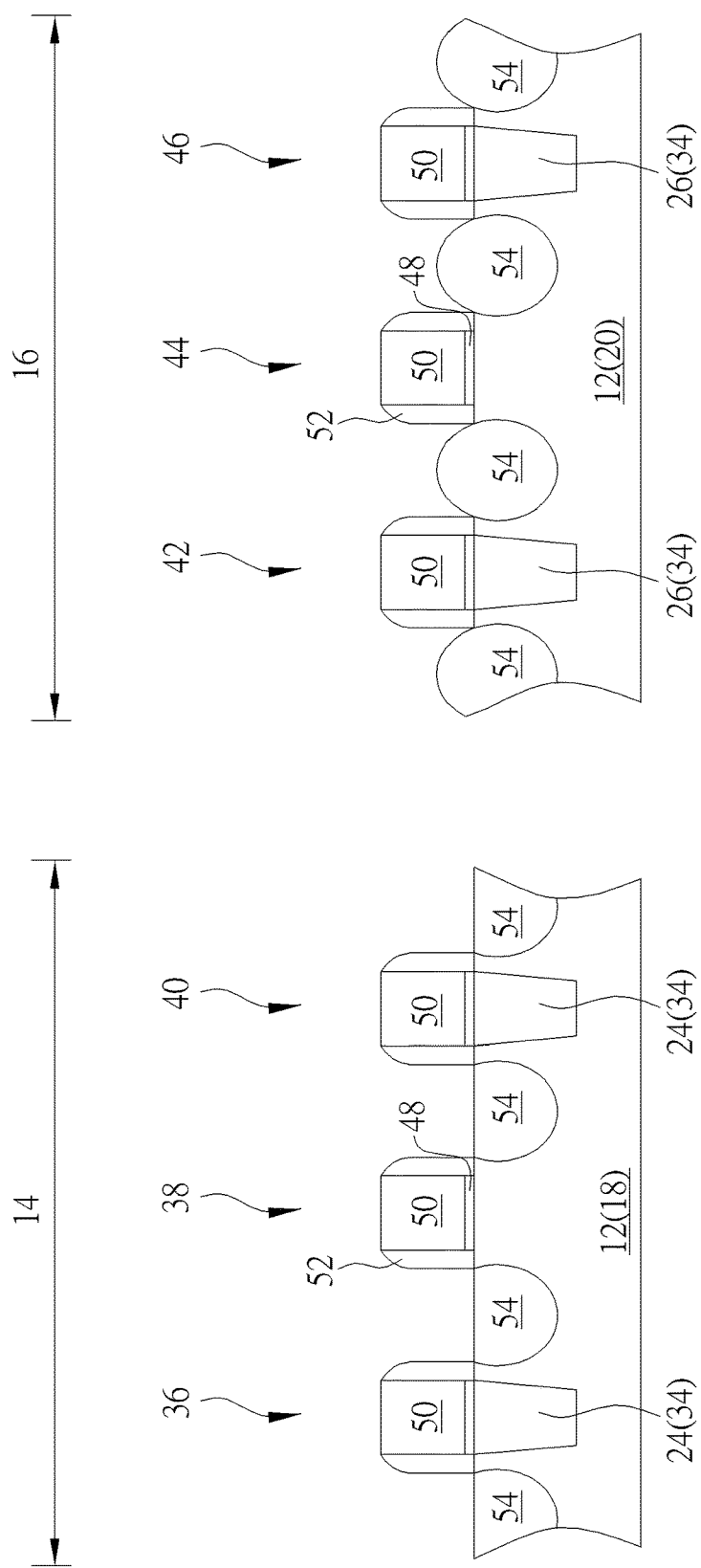

Referring to FIGS. 1-2, in which FIG. 1 is a top view illustrating a semiconductor device according to an embodiment of the present invention, the left portion of FIG. 2 illustrates a cross-sectional view of FIG. 1 for fabricating the semiconductor device along the sectional line AA', and the right portion of FIG. 2 illustrates a cross-sectional view of FIG. 1 for fabricating the semiconductor device along the sectional line BB'. As shown in FIGS. 1-2, a substrate 12, such as a silicon substrate or silicon-on-insulator (SOI) substrate is first provided, and at least a transistor region such as a NMOS region 14 and a PMOS region 16 are defined on the substrate 12. Next, at least a fin-shaped structure 18 is formed on the substrate 12 on the NMOS region 14 and at least a fin-shaped structure 20 is formed on the substrate 12 on the PMOS region 16, in which the bottom of the fin-shaped structures 18, 20 is surrounded by an insulating layer or shallow trench isolation (STI) 22 made of material including but not limited to for example silicon oxide. It should be noted that even though this embodiment pertains to the fabrication of a non-planar FET device such as FinFET device, it would also be desirable to apply the following processes to a planar FET device, which is also within the scope of the present invention.

Preferably, the fin-shaped structures 18, 20 of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 18, 20 could also be obtained by first forming a patterned mask (not shown) on the substrate, 12, and through an etching process, the pattern of the patterned mask is transferred to the substrate 12 to form the fin-shaped structures 18. Moreover, the formation of the fin-shaped structures 18, 20 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 18, 20. These approaches for forming fin-shaped structure are all within the scope of the present invention.

Next, single diffusion break (SDB) structures 24, 26 are formed crossing the fin-shaped structure 18, 20 on the NMOS region 14 and PMOS region 16 respectively. In this embodiment, the formation of the SDB structures 24, 26 could be accomplished by first forming a patterned mask (not shown) on the substrate 12 and then conducting an etching process by using the patterned mask as mask to remove part of the fin-shaped structures 18, 20 along a direction orthogonal to the extending direction of the fin-shaped structures 18, 20 to form trenches 28 while dividing the fin-shaped structures 18, 20 into two portions. For instance, the trenches 28 formed on the NMOS region 14 preferably divide the fin-shaped structures 18 into first portions 30 on the left side of the SDB structures 24 and second portions 32 on the right side of the SDB structures 24, in which the trenches 28 preferably define the position of the SDB structures formed afterwards.

Next, a dielectric layer 34 is formed in the trenches 28 on the NMOS region 14 and the PMOS region 16 to fill the trenches 28, and a planarizing process such as chemical mechanical polishing (CMP) process is conducted to remove part of the dielectric layer 34 to form SDB structures 24, 26, in which the top surface of the remaining dielectric layer 34 or SDB structures 24, 26 is substantially even with the top surface of the fin-shaped structures 18, 20. In this embodiment, the fin-shaped structures 18, 20 are disposed along a first direction (such as X-direction) while the SDB structures 24, 26 on each of the MOS regions are disposed along a second direction (such as Y-direction) orthogonal to the first direction.

Next, gate structures 36, 38, 40, 42, 44, 46 are formed on the fin-shaped structures 18, 20 and SDB structures 24, 26 on the NMOS region 14 and PMOS region 16, in which the gate structures 36, 38, 40, 44 on the NMOS region 14 and PMOS region 16 are preferably dummy gates that will be transformed into metal gates in the later process.

In this embodiment, the formation of the gate structure 36, 38, 40, 42, 44, 46 could be accomplished by a gate first process, a high-k first approach from gate last process, or a high-k last approach from gate last process. Since this embodiment pertains to a high-k last approach, a gate dielectric layer or interfacial layer, a gate material layer made of polysilicon, and a selective hard mask could be formed sequentially on the substrate 12, and a pattern transfer process is then conducted by using a patterned resist (not shown) as mask to remove part of the gate material layer and part of the gate dielectric layer through single or multiple etching processes. After stripping the patterned resist, gate structures 36, 38, 40, 42, 44, 46 composed of patterned gate dielectric layer 48 and patterned gate material layer 50 are formed on the substrate 12.

Next, at least a spacer 52 is formed on the sidewalls of each of the gate structures 36, 38, 40, 42, 44, 46, a source/drain region 54 and/or epitaxial layer (not shown) is formed in the substrate 12 adjacent to two sides of the spacer 52, and a selective silicide layer (not shown) could be formed on the surface of the source/drain region 54. In this embodiment, each of the spacer 52 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain region 54 could include dopants and epitaxial material of different conductive type depending on the type of device being fabricated. For example, the source/drain region 54 on the NMOS region 14 could include SiC or SiP while the source/drain region 54 on the PMOS region 16 could include SiGe, but not limited thereto.

Figure 3:
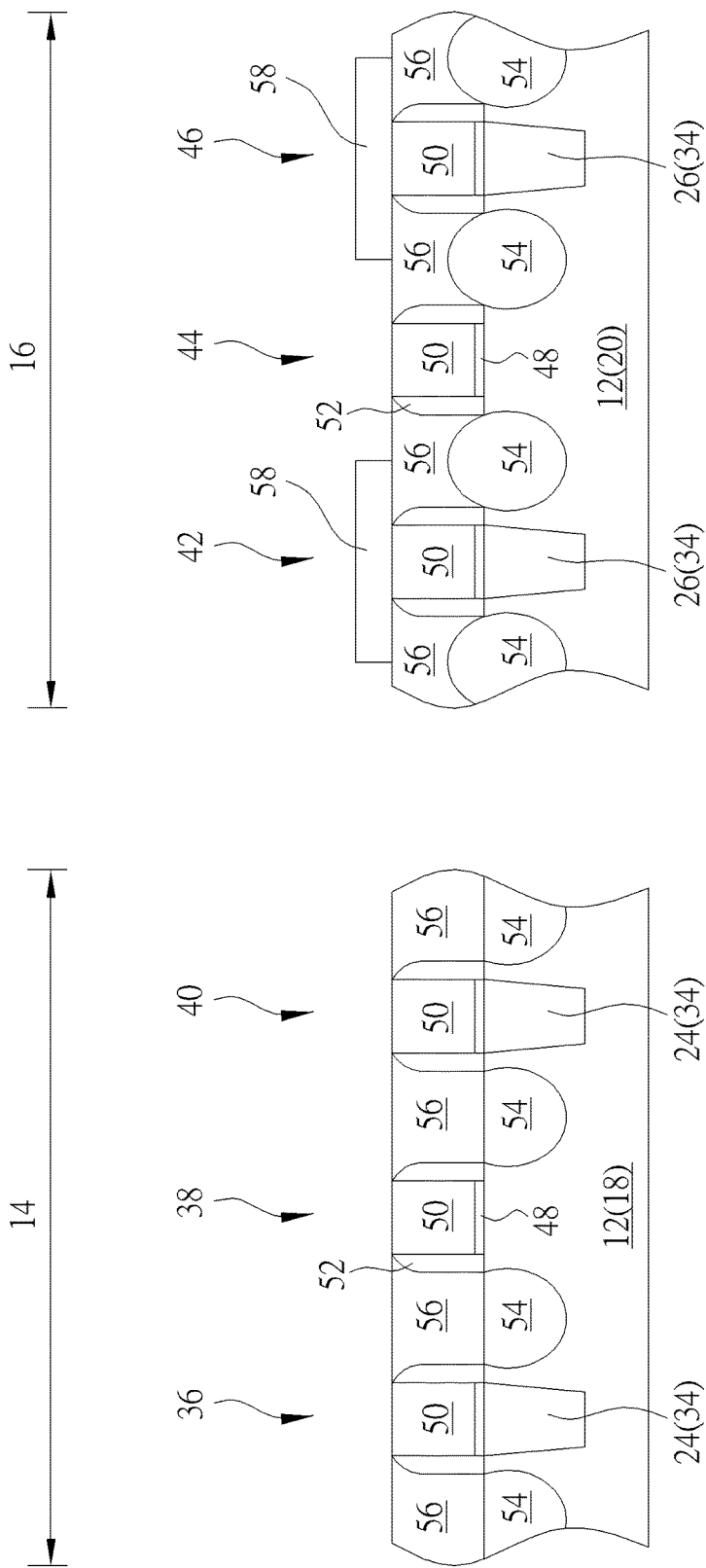

Next, as shown in FIG. 3, a contact etch stop layer (CESL) (not shown) could be selectively formed on the substrate 12 surface and the gate structures 36, 38, 40, 42, 44, 46, and an interlayer dielectric (ILD) layer 56 is formed on the CESL afterwards. Next, a planarizing process such as a chemical mechanical polishing (CMP) process is conducted to remove part of the ILD layer 56 and part of the CESL to expose the gate material layer 50 composed of polysilicon so that the top surfaces of the gate material layer 50 and ILD layer 56 are coplanar.

Next, a patterned mask 58 is formed on the gate structures 42, 46 on the PMOS region 16, in which the patterned mask 58 preferably covers the gate structures 42, 46 directly on top of the SDB structures 26 and part of the ILD layer 56 while exposing the top surface of the gate structure 44 directly on top of the fin-shaped structure 20. It should be noted that the patterned mask 58 in this embodiment is only disposed on the PMOS region 16 while not covering any part of the NMOS region 14 so that as the patterned mask 58 is disposed on the PMOS region 16, the top surface of the ILD layer 56 and all of the gate structures 36, 38, 40 directly on top of the SDB structures 24 and adjacent to the SDB structures 24 are exposed. In this embodiment, the patterned mask 58 is preferably made of silicon nitride, but could also be made of any other material having etching selectivity with the gate material layer and ILD layer 56. For instance, the patterned mask 58 could also include dielectric material such as SiON or SiCN.

Figure 4:
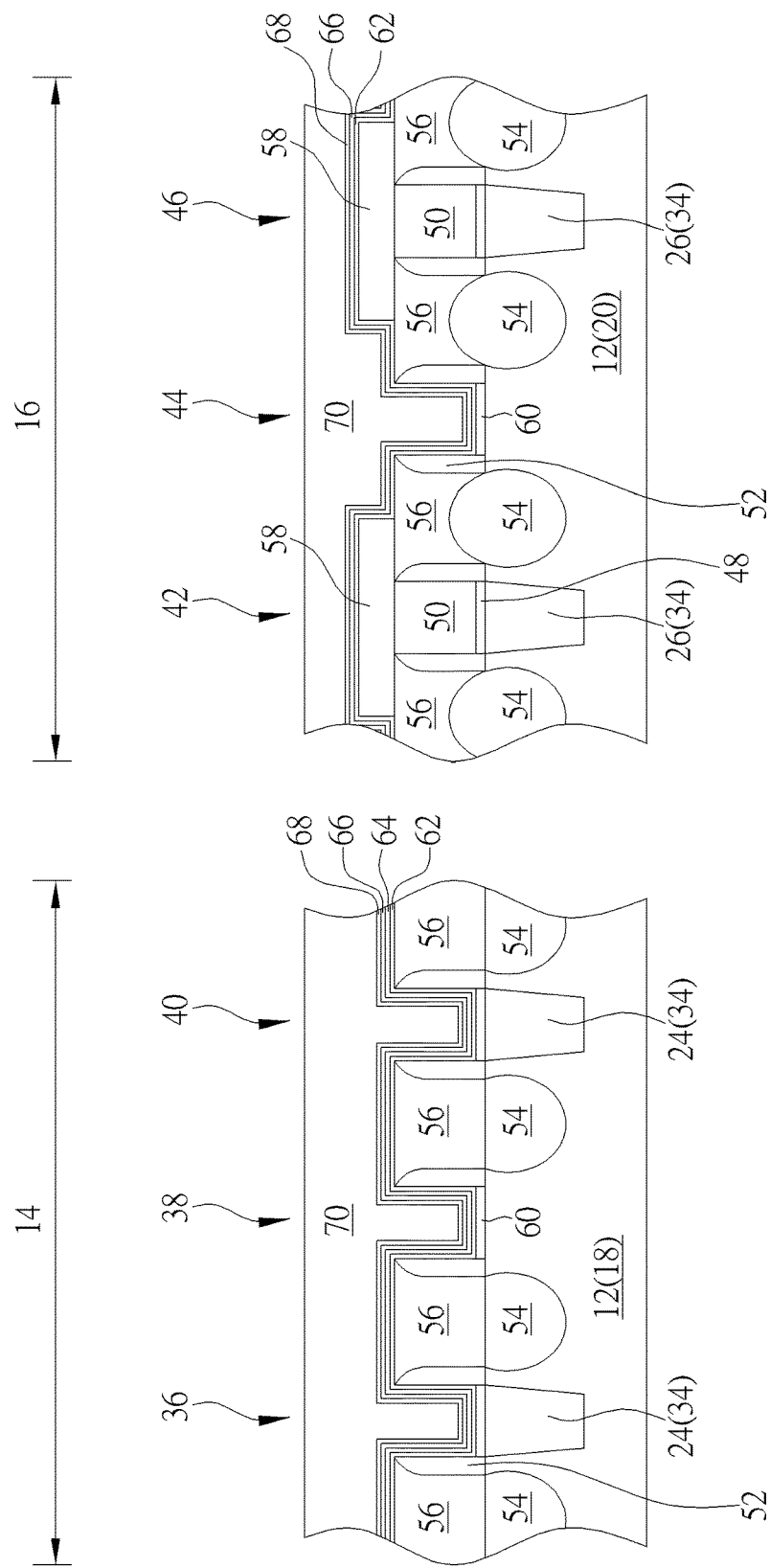

Next, as shown in FIG. 4, a replacement metal gate (RMG) process is conducted to transform the gate structures 36, 38, 40 on NMOS region 14 and gate structure 44 on PMOS region 16 into metal gates. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 50 or even gate dielectric layer 48 from gate structure 36, 38, 40 on NMOS region 14 and gate structure 44 on PMOS region 16 for forming recesses (not shown) in the ILD layer 56. Next, a selective interfacial layer 60 or gate dielectric layer (not shown), a high-k dielectric layer 62, a selective barrier layer (not shown), and a work function metal layer 64 are formed in the recesses on NMOS region 14 and PMOS region 16, another patterned mask (not shown) such as a patterned resist is formed to cover the NMOS region 14, an etching process is conducted to remove the work function metal layer 64 on PMOS region 16, the patterned mask is removed, and another work function metal layer 66 is formed on the NMOS region 14 and PMOS region 16. Next, another barrier layer 68 such as a top barrier metal (TBM) layer and a low resistance metal layer 70 are formed to fill the recesses completely.

In this embodiment, the high-k dielectric layer 62 is preferably selected from dielectric materials having dielectric constant (k value) larger than 4. For instance, the high-k dielectric layer 62 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Preferably, the work function metal layers 64 and 66 are formed for tuning the work function of the metal gate in accordance with the conductivity of the device. In this embodiment, the work function metal layer 64 is preferably an n-type work function metal layer having a work function ranging between 3.9 eV and 4.3 eV, which may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but not limited thereto. The work function metal layer 66 on the other hand is a p-type work function metal layer having a work function ranging between 4.8 eV and 5.2 eV, which may include titanium nitride (TiN), tantalum nitride (TaN), or tantalum carbide (TaC), but not limited thereto. The optional barrier layer disposed between the high-k dielectric layer 62 and work function metal layer 64 and the barrier layer 68 disposed between the work function metal layer 66 and low resistance metal layer 70 could include titanium (Ti), titanium nitride (TiN), tantalum (Ta) or tantalum nitride (TaN). Furthermore, the low-resistance metal layer 40 may include copper (Cu), aluminum (Al), titanium aluminum (TiAl), cobalt tungsten phosphide (CoWP) or any combination thereof.

Figure 5:
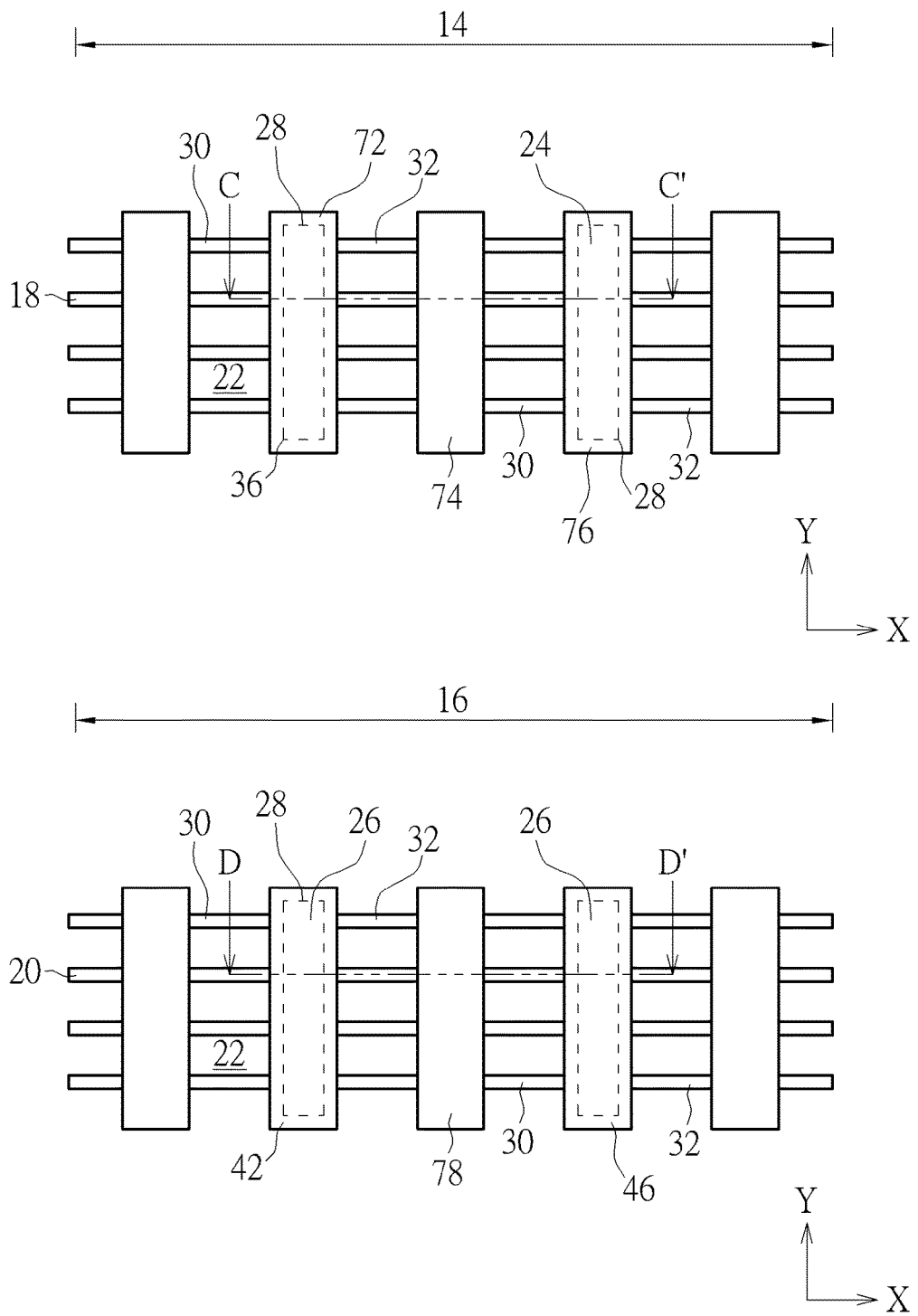
Figure 6:
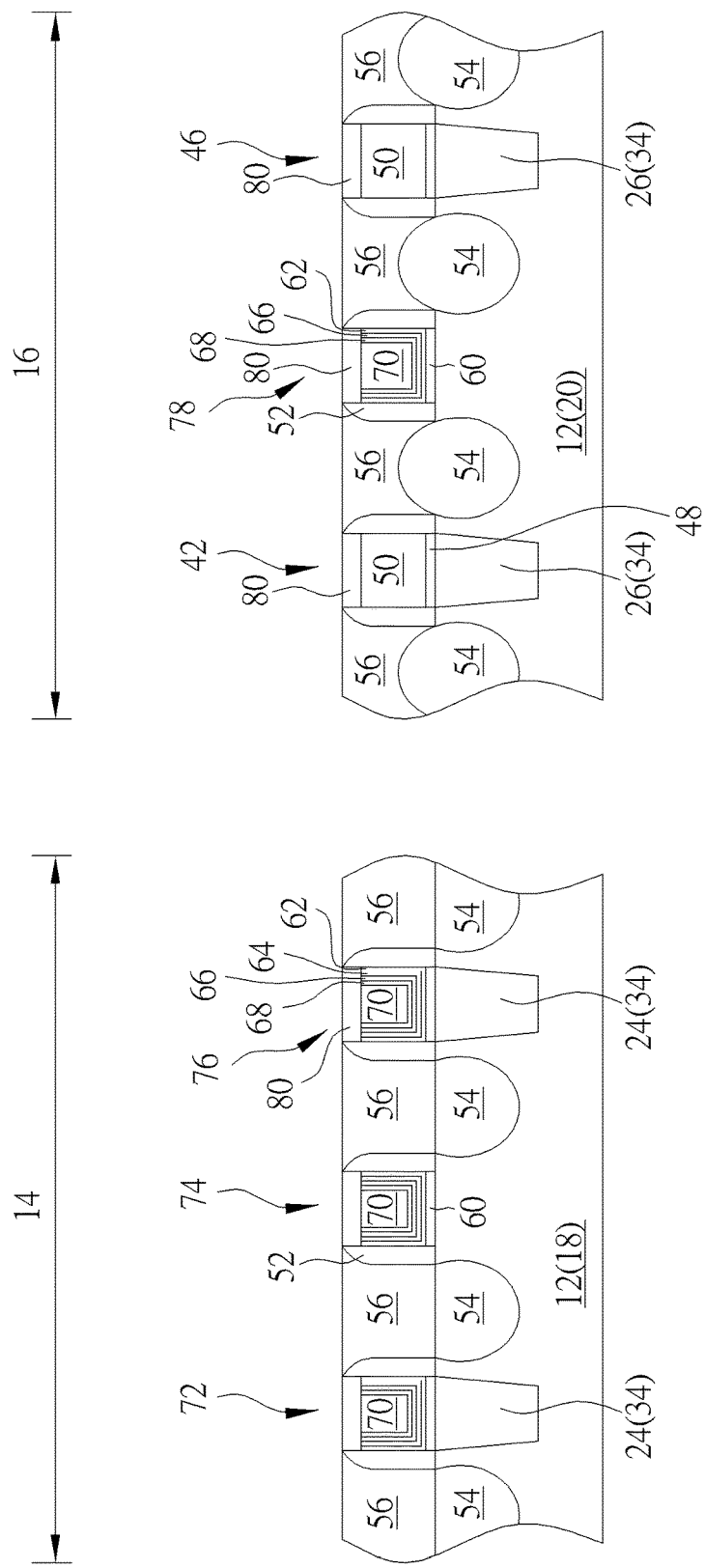

Referring to FIGS. 5-6, FIG. 5 illustrates a top view for fabricating the semiconductor device following FIG. 4, the left portion of FIG. 6 illustrates a cross-sectional view of FIG. 5 for fabricating the semiconductor device along the sectional line CC', and the right portion of FIG. 6 illustrates a cross-sectional view of FIG. 5 for fabricating the semiconductor device along the sectional line DD'. As shown in FIGS. 5-6, a planarizing process, such as a CMP process is conducted to remove part of the low resistance metal layer 70, part of the barrier layer 68, part of the work function metal layer 66, part of the work function metal layer 64, and part of the high-k dielectric layer 62 on NMOS region 14 and PMOS region 16 as well as the patterned mask 58 on PMOS region 16. This forms gate structures 72, 74, 76 made of metal gates directly on the SDB structure 24 and adjacent fin-shaped structures 18 on NMOS region 14 and at the same time forms a gate structure 78 made of metal gate on the fin-shaped structure 20 between SDB structures 26 on PMOS region 16. It should be noted that due to the coverage of the patterned mask 58, the gate structures 42 and 46 disposed directly on top of the SDB structure 26 on PMOS region 16 are not transformed into metal gates during the aforementioned RMG process. Instead, the gate structures 42 and 46 are remained as polysilicon gates throughout the RMG process. Conversely, all of the gate structures 36, 38, 40 directly on the SDB structures 24 and adjacent to the SDB structures 24 on NMOS region 14 are transformed into metal gates since the entire region is not covered by the patterned mask 58.

Next, part of the gate structures 42, 46, 72, 74, 76, 78 made of metal gates and polysilicon gates are removed, and a deposition process along with a planarizing process are conducted to form hard masks 80 made of material such as silicon nitride on the gate structures 42, 46, 72, 74, 76, 78. Next, contact plug formation and metal interconnective process could be conducted depending on the demand of the product to form contact plugs in the ILD layer 56 on NMOS region 14 and PMOS region 16 for electrically connecting the source/drain regions and metal interconnections on the ILD layer 56 to electrically connect the contact plugs. This completes the fabrication of a semiconductor device according to an embodiment of the present invention.

Referring to FIG. 6, FIG. 6 further illustrates structural view of a semiconductor device according to an embodiment of the present invention. As shown in FIG. 6, the semiconductor device includes a substrate 12 having a NMOS region 14 and a PMOS region 16, fin-shaped structures 18, 20 disposed on the substrate 12 on NMOS region 14 and PMOS region 16 respectively, at least a SDB structure 24 in the fin-shaped structures 18 on NMOS region 14, at least a SDB structure 26 in the fin-shaped structures 20 on PMOS region 16, and gate structures 42, 46, 72, 74, 76, 78 disposed on the SDB structures 24, 26 and fin-shaped structures 18, 20 on NMOS region 14 and PMOS region 16.

Preferably, all of the gate structures on the NMOS region 14, including the gate structures 72, 76 directly on the SDB structures 24 and the gate structure 74 on the fin-shaped structures 18 are metal gates. In contrast to NMOS region 14, the gate structures 42, 46 directly on top of the SDB structures 26 and the gate structure 78 on the fin-shaped structures 20 on PMOS region 16 are different. For instance, the gate structures 42, 46 directly on top of the SDB structures 26 are polysilicon gates while the gate structure 78 on the fin-shaped structures 20 is a metal gate.

Preferably, the aforementioned metal gates are fabricated through a high-k last process, in which each of the gate structures 72, 74, 76 containing metal gates on NMOS region 14 preferably includes an interfacial layer 60 or gate dielectric layer, a U-shaped high-k dielectric layer 62, a U-shaped work function metal layer 64, a U-shaped work function metal layer 66, a barrier layer 68, and a low resistance metal layer 70. Each of the gate structures 78 containing metal gates on PMOS region 16 on the other hand includes an interfacial layer 60 or gate dielectric layer, a U-shaped high-k dielectric layer 62, a U-shaped work function metal layer 66, a barrier layer 68, and a low resistance metal layer 70.

Overall, the present invention preferably conducts a RMG process to transform the polysilicon gate adjacent to the SDB structure on PMOS region and even all of the polysilicon gates on NMOS region into metal gates while the polysilicon gates directly on top of the SDB structures on PMOS region are kept the same. It should be noted that when polysilicon material of the dummy gates are removed during RMG process as shown in aforementioned FIG. 4, the stress of epitaxial layer within the substrate or fin-shaped structure is released accordingly. This phenomenon of stress release is much more prominent when gate structure directly on top of the SDB structure is removed and the amount of stress applied to the adjacent channel region would be reduced significantly.

In order to prevent that the channel area on PMOS region not getting enough stress as a result of aforementioned stress release, the present invention preferably forms a patterned mask on the gate structures directly on top of the SDB structures on PMOS region during RMG process so that only the gate structure adjacent to the SDB structures is transformed into metal gate while the gate structures directly on top of the SDB structures are maintained as polysilicon gates. This ensures that the channel region on PMOS region would receive sufficient stress after the RMG process and the performance of the device is maintained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a first MOS region comprises a PMOS region and a second MOS region comprises a NMOS region on a substrate:
a first fin-shaped structure on the PMOS region;
a first single diffusion break (SDB) structure in the first fin-shaped structure;
a first gate structure on the first SDB structure;
a second gate structure on the first fin-shaped structure, wherein the first gate structure and the second gate structure are of different materials and the first gate structure disposed directly on top of the first SDB structure is a polysilicon gate while the second gate structure disposed on the first fin-shaped structure is a metal gate in the PMOS region of the first MOS region;
a second fin-shaped structure on the NMOS region;
a second SDB structure in the second fin-shaped structure; and
a third gate structure on the second SDB structure and a fourth gate structure on the second fin-shaped structure, wherein the third gate structure and the fourth gate structure are of same material, the third gate structure disposed directly on top of the second SDB structure is a metal gate and the fourth gate structure disposed on the second fin-shaped structure is also a metal gate in the NMOS region of the second MOS region, wherein each of the metal gates on the PMOS region and the NMOS region is transformed from a dummy gate, while the polysilicon gate is an active gate made of polysilicon.

2. The semiconductor device of claim 1, wherein the first SDB structure comprises silicon nitride.

3. The semiconductor device of claim 1, wherein the first fin-shaped structure is disposed extending along a first direction and the first SDB structure is disposed extending along a second direction.

4. The semiconductor device of claim 3, wherein the first direction is orthogonal to the second direction.

5. The semiconductor device of claim 1, wherein the second fin-shaped structure is disposed extending along a first direction and the second SDB structure is disposed extending along a second direction.

6. The semiconductor device of claim 5, wherein the first direction is orthogonal to the second direction.

* * * * *